(12) United States Patent
Pozzoni et al.

(10) Patent No.: US 12,476,622 B2
(45) Date of Patent: Nov. 18, 2025

(54) DUTY CYCLE CALIBRATION CIRCUIT, CORRESPONDING TRANSMITTER, COMMUNICATION SYSTEM AND METHOD

(71) Applicant: STMicroelectronics International N.V., Geneva (CH)

(72) Inventors: Massimo Pozzoni, Pavia (IT); Paolo Viola, Pavia (IT); Pasquale D'Argenio, Mercogliano (IT); Augusto Andrea Rossi, Pavia (IT)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/631,798

(22) Filed: Apr. 10, 2024

(65) Prior Publication Data
US 2024/0356537 A1    Oct. 24, 2024

(30) Foreign Application Priority Data
Apr. 24, 2023   (IT) .................. 102023000007998

(51) Int. Cl.
  *H03K 3/017*   (2006.01)
  *H03K 5/24*    (2006.01)
  *H03K 17/567*  (2006.01)

(52) U.S. Cl.
  CPC .............. *H03K 3/017* (2013.01); *H03K 5/24* (2013.01); *H03K 17/567* (2013.01)

(58) Field of Classification Search
  None
  See application file for complete search history.

(56) References Cited

U.S. PATENT DOCUMENTS

| | | | |
|---|---|---|---|
| 7,058,120 B1 * | 6/2006 | Lu | H03M 9/00 375/373 |
| 10,699,669 B2 * | 6/2020 | Amirkhany | G09G 5/008 |
| 11,115,177 B2 * | 9/2021 | Ke | H03M 9/00 |
| 11,804,828 B2 * | 10/2023 | Qi | H03K 5/1565 |
| 12,166,490 B2 * | 12/2024 | Lee | H03K 5/1565 |
| 2009/0177457 A1 | 7/2009 | Dai et al. | |
| 2019/0229712 A1 | 7/2019 | Suzuki et al. | |
| 2021/0152167 A1 | 5/2021 | Doppalapudi et al. | |

* cited by examiner

*Primary Examiner* — Cassandra F Cox
(74) *Attorney, Agent, or Firm* — Slater Matsil, LLP

(57) ABSTRACT

In embodiments, a clock signal calibration circuit for communication transmitters includes a multiplexer that creates a combined output pattern from input data patterns in reaction to the clock signal's edges. It uses a calibration data pattern generator, which supplies two sequential patterns—the second being a shifted copy of the first—to the multiplexer. An averaging circuit then generates two averaged signals corresponding to these patterns. Duty cycle control circuitry corrects clock signal imbalances if these averaged signals are unequal, thus adjusting the duty cycle distortion to achieve an ideal 50% duty cycle.

20 Claims, 5 Drawing Sheets

DUTY CYCLE CALIBRATION CIRCUIT, CORRESPONDING TRANSMITTER, COMMUNICATION SYSTEM AND METHOD

CROSS-REFERENCE TO RELATED APPLICATIONS

This application is a translation of and claims the priority benefit of Italian patent application number 102023000007998, filed on Apr. 24, 2023, entitled "Duty cycle calibration circuit, corresponding transmitter, communication system and method" which is hereby incorporated by reference herein in its entirety.

TECHNICAL FIELD

The description relates to communication techniques. Solutions described herein can be applied, for instance, to high-speed data communications over a wired interconnection.

BACKGROUND

High-speed serial communication over a wired interconnection may involve a high-speed transmitter that transmits data symbols based on a high-speed (high frequency) clock signal, sending a symbol at each clock transition. Timing performance degradation (essentially, timing jitter) may undesirably arise when using rising (positive) and falling (negative) clock edges as a consequence of possible duty cycle distortion in the original clock. If the duty cycle of the original clock is not 50%, such an error in the clock duty cycle will directly translate into a timing error of the transmitted symbols. For that reason, duty cycle correction techniques can be applied. These correction techniques are effective in so far as the duty cycle is measured adequately and a likewise adequate correction is determined and then applied.

SUMMARY

An object of one or more embodiments is to contribute in providing such an effective duty cycle correction technique. According to one or more embodiments, that object is achieved via a circuit having the features set forth in the claims that follow. For instance, one or more embodiments relate to a corresponding transmitter (for high-speed data communications over a wired interconnection). One or more embodiments relate to a corresponding communication system (a high-speed data communications system over a wired interconnection, for instance). One or more embodiments relate to a corresponding method. The claims are an integral part of the technical teaching provided in respect of the embodiments.

In solutions as described herein, a duty cycle is measured in calibration phases at a transmitter side, where a value for duty cycle distortion is obtained via averaging (possibly, by integrating or low-pass filtering) an input calibration pattern and a shifted (logically inverted, for instance) calibration pattern. These two measurements of the averaged values can be performed via a comparator with a programmable threshold (for instance, if the comparator toggles its output for the same value of the programmable threshold for the two measurements, the duty cycle error is null) or a low-frequency analog-to-digital converter (ADC).

In the solutions described herein, the duty cycle is corrected until the error falls below a threshold, thus having a 50% duty cycle as a target. Solutions, as described herein, are compatible with a high-speed environment, in so far as low-frequency measurements are involved; are largely insensitive to undesired supply or noise effect, in so far as the same measurement is performed on two different patterns; and do not require measurement features provided in the receiver, in so far as these features can be (fully) contained in the transmitter to be calibrated.

BRIEF DESCRIPTION OF THE DRAWINGS

One or more embodiments will now be described, by way of example only, with reference to the annexed figures, wherein.

Figure 1:
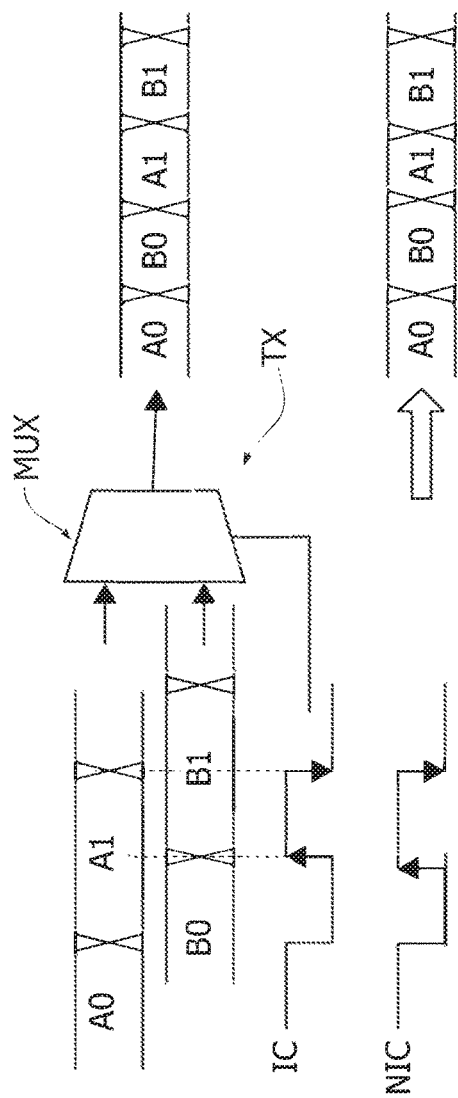
FIG. 1 is a diagram exemplary of a transmitter that multiplexes two data streams into a single output data stream.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature. For simplicity, single-ended signals are represented and assumed throughout this description for input patterns, clocks, output patterns, etc. Differential signals are commonly used in real environments: the single-ended signals represented here may thus represent either real single-ended signals, the difference between two terminals of differential signals, or one of the two lines of a differential signal.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised of at least one embodiment. Hence, phrases such as "in an embodiment" or "in one embodiment" that may be present in one or more points of the present description do not necessarily refer to the same embodiment. Moreover, particular conformations, structures, or characteristics may be combined in any adequate way in one or more embodiments. The headings/references used herein are provided merely for convenience and, hence, do not define the extent of protection or the scope of the embodiments. For simplicity and ease of explanation, throughout this description, and unless the context indicates otherwise, like parts or elements are indicated in the various figures with like reference signs, and a corresponding description will not be repeated for every figure.

As discussed in the introductory portion of the present description, high-speed communication (for instance, serial communication) over a wired interconnection may rely on a high-speed transmitter that transmits data symbols based on a high-speed (high-frequency) clock and sends an information symbol at each clock transition.

Merely by way of background (and without limiting effects on the embodiments), high-speed/high-frequency as used herein may refer to bitrates/frequencies in the range of 1 Gb/s to 200 Gb/s.

The same underlying principles of the solution described herein can, however, also be applied to (much) lower operating frequencies, such as a few hundred MB/s, for instance.

Using rising (positive, low-to-high) and falling (negative, high-to-low) clock edges may produce undesired degradation of timing performance (essentially, timing jitter) as a consequence of possible duty cycle-distortion in the original clock: if the original clock does not exhibit a 50% duty cycle, such an error in the clock duty cycle will directly translate into a timing error of the transmitted symbols.

By way of background, it is recalled that the designation "duty cycle" applies to a pulsed signal to designate the ratio (usually expressed as a percentage) of pulse duration/width to the total period of the waveform.

For instance, in signals with a rectangular waveform (high=logic "1" and low=logic "0"), the value 1 may be regarded as indicative of the presence of an electric pulse, while the value 0 indicates the absence of an electric pulse. A corresponding signal thus has a 50% duty cycle if the pulse remains high for half its period and low for half the period.

The difference in timing between the duration of a positive clock and a negative clock can give rise to a duty cycle distortion.

FIG. 1 is a diagram exemplary of the basic layout of a (per se conventional) transmitter TX comprising (in addition to other elements, not visible for simplicity) a multiplexer MUX that multiplexes two input data streams A0, A1, . . . and B0, B1, . . . into a single output data stream A0, B0, A1, B1, . . . and so on.

As used throughout this description, the designation "multiplexer" (see the multiplexer MUX of FIGS. 1 and 2, or the multiplexer 12 of FIG. 4, for instance) applies to circuitry that multiplexes input patterns (two input patterns, for instance) by transmitting each of these patterns in response to respective clock edges (rising edges and falling edges) rather than by switching between the input patterns.

For ease of understanding, one may consider by way of example the simple case of two input sequences A0, A1, . . . and B0, B1, . . . where the first input sequence A0, A1, . . . is transferred to the output of the multiplexer in response to the rising edges of the clock signal IC; and the second input sequence B0, B1, . . . is transferred to the output of the multiplexer in response to the falling edges of the clock signal IC.

A possibility would also exist of operating in a complementary manner so that the first input sequence A0, A1, . . . is transferred to the output of the multiplexer in response to the falling edges of the clock signal IC; and the second input sequence B0, B1, . . . is transferred to the output of the multiplexer in response to the rising edges of the clock signal IC.

Such a multiplexer can be regarded as having inputs configured to receive input data patterns and to multiplex the input data patterns into a multiplexed output pattern in response to rising and falling edges in the clock signal CLK from a clock signal generator (such as the generator 14 discussed in connection with FIG. 4).

Whatever the option adopted for implementing such a multiplexer, with the input data streams clocked by an ideal clock signal IC having a (perfect) 50% duty cycle, the data indicated by A0, A1, . . . will have the same duration of the data indicated by B0, B1, . . . as exemplified by the curve reproduced at the top of the right-hand side of FIG. 1.

Conversely, in the presence of a non-ideal clock signal NIC affected by duty cycle distortion (namely a duty cycle different from 50% so that, for instance, the logic "1" times are longer than the logic "0" times), the duty cycle distortion will adversely affect the transmitted data pattern data stream A0, B0, A1, B1, . . . .

For instance, the data indicated by A0, A1, . . . (expected to have the same duration as the data indicated by B0, B1, . . . ) may, in fact, have different (for instance, shorter) durations, as exemplified at the bottom of the right-hand side of FIG. 1.

It is noted that while multiplexing two input data streams A0, A1, . . . and B0, B1, . . . is considered here for ease of explanation, the same drawback discussed in the foregoing resulting from a non-ideal clock having a duty cycle different from 50% can affect arrangements where more than two data streams are multiplexed.

Correcting duty cycle distortion in a clock signal used to transmit high-speed serial data using both positive (rising) edges and negative (falling) edges is thus a desirable goal. The availability of features that facilitate correcting the duty cycle of a clock signal to modify it to, for instance, an "ideal" 50% value benefits the correction of duty cycle distortion of a clock signal.

Adequately applying this correction benefits from adequately measuring the duty cycle, as this measurement provides the information on the error to be reduced (minimized) by the duty cycle correction means feature. Adequately measuring the duty cycle is thus an object of embodiments as exemplified herein. To that effect, certain conventional solutions increase or decrease step-wise the phase of a secondary clock, and a number is counted of the steps needed to cover the range from a positive to a negative edge and from a negative to a positive edge of a pattern that is affected by the duty cycle degradation. The difference in the time steps associated with these two measurements indicates a duty cycle error that needs to be corrected. That solution can be applied in a receiver in order to measure the quality of the duty cycle of a signal that the receiver receives from a transmitter. This involves a calibration phase during which the transmitter can be controlled and a corresponding signal is sent to the receiver. This calibration phase may not be available in certain applications where the transmitter to be calibrated cannot be connected to the receiver; being able to perform the measurements involved in the calibration at the transmitter would thus be desirable.

Solutions, as described herein, facilitate performing transmitter calibration at the transmitter without involving a receiver. A technique employed in solutions as described herein involves measuring the presence of duty cycle distortion (to facilitate compensation) based on a calibration phase where a dedicated calibration pattern (a dedicated pattern in certain examples) is also transmitted as a "shifted" calibration pattern.

In the purely exemplary case where the calibration pattern is selected at the same rate as a transmitting clock, shifting may take the form of logical inversion (low>high, high>low, for instance).

More generally, solutions, as proposed herein, are applicable to cases where, in the presence of duty cycle distortion, a "direct" calibration pattern and its "shifted" version are altered in such a way that if a (positive, for instance) duty cycle distortion increases the average value of the direct pattern, the same duty cycle distortion decreases the average value of the shifted pattern.

When the two calibration patterns are (mutually) shifted, the low-to-high and high-to-low transitions in the shifted calibration pattern will be triggered by opposite clock transitions with respect to the corresponding low-to-high and high-to-low transitions of the direct pattern.

Stated otherwise, a calibration data pattern generator such as 120 can be configured to apply to the inputs of the multiplexer 12 the sequence of a first calibration data pattern A, during a first calibration phase or step; and a second calibration data pattern SHIFT(A), during a second calibration phase or step.

As illustrated herein, the first calibration data pattern A has a first configuration of transitions between logical values, and the second shifted calibration data pattern SHIFT(A) is a replica of the first calibration data pattern A having a second (different) configuration of transitions between logical values.

As illustrated, the second configuration of transitions between logical values of the second calibration data pattern SHIFT(A) is shifted with respect to the first configuration of transitions between logical values of the first calibration data pattern A. The principle underlying such an approach is exemplified in FIG. 2. Here again (like in FIG. 1), the basic layout of a transmitter TX is illustrated comprising (in addition to other elements that are not visible for simplicity) a multiplexer MUX that multiplexes two input data streams A0, A1, . . . and B0, B1, . . . into a single output data stream A0, B0, A1, B1, . . . and so on.

Again, as used throughout this description, the designation "multiplexer" applies to circuitry that multiplexes input patterns by transmitting each of these patterns in response to respective clock edges (rising edges and falling edges) rather than by switching between the input patterns.

Figure 2:
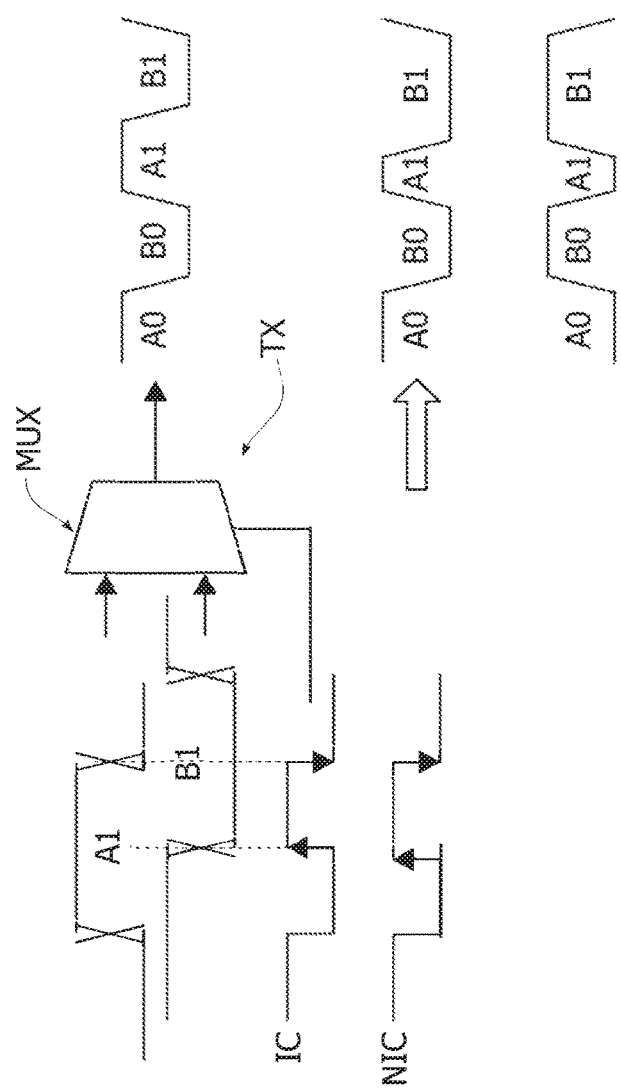
FIG. 2 is a diagram exemplary of principles underlying application of embodiments of the present description to a transmitter as illustrated in FIG. 1.

Assuming that these data streams are clocked by an ideal clock signal IC having a (perfect) 50% duty cycle, the resulting data stream indicated by A0, A1, . . . will have the same duration as the data indicated by B0, B1, . . . as exemplified by the curve reproduced at the top of the right-hand side of FIG. 2.

In the presence of a non-ideal clock (NIC) affected by duty cycle distortion (namely, a duty cycle different from 50% so that, for instance, the logic "1" times are longer than the logic "0" times), the duty cycle distortion will adversely affect the transmitted data pattern data stream A0, B0, A1, B1, . . . with, for instance, the data indicated by A0, A1, . . . (expected to have the same duration of the data indicated by B0, B1, . . . ) will in fact have a different (for instance, shorter) duration as exemplified by the (two) curves reproduced at the bottom of the right-hand side of FIG. 2.

There, the possible effect of duty cycle distortion is shown on a "direct", non-shifted (non-inverted, for instance), version, designated A, of the transmitted data pattern or stream, for instance, A0 and A1 "high" or "1" and B0, B1 "low" or "0" (upper curve at the bottom of the right-hand side of FIG. 2), and a "shifted" (logically inverted, for instance), replica, designated SHIFT(A), of the transmitted data pattern or stream, for instance, A0 and A1 "low" or "0" and B0, B1 "high" or "1" (lower curve at the bottom of the right-hand side of FIG. 2).

It is noted that the shifting operation (inversion, for instance) can be compensated by a complementary shifting (a further inversion, for instance) in a subsequent processing stage (not visible for simplicity).

Calculating the average values of the transmitter's output for the two calibration patterns facilitates identifying a duty cycle distortion as an alteration in these average values, for instance, as a difference between these average values.

As discussed herein, averaging circuitry (16 in FIG. 4) can be coupled to the output of the multiplexer 12 and be configured to produce a first averaged signal AVE(A) and a second averaged signals AVE(SHIFT(A) in response to the inputs of the multiplexer 12 receiving the first calibration data pattern A or the second calibration data pattern SHIFT (A), respectively.

Duty cycle control circuitry (see the elements 20 and 22 discussed in the following) can be configured to detect a duty cycle distortion condition in the clock signal CLK from the clock signal generator 14 in response to the first averaged signal AVE(A) and the second averaged signal AVE(SHIFT (A) failing to have a same value.

For instance, the duty cycle control circuitry can be configured to apply to the duty cycle control input 14A of the clock signal generator 14 a duty cycle distortion compensation signal based on the amount the first averaged signal AVE(A) and the second average signals AVE(SHIFT(A) diverge from having a same value (by having a difference therebetween, for instance), targeting a 50% duty cycle of the clock signal CLK of the clock signal generator 14.

For instance, the duty cycle control circuitry 20, 22 can be configured to apply to the duty cycle control input 14A of the clock signal generator 14, a duty cycle distortion compensation signal based on the difference between the first averaged signal AVE(A) and the second averaged signal AVE(SHIFT(A).

In certain embodiments, depending on the polarity of SHIFT(A), the difference in question may be calculated as a sum (in case an inversion is added on the shifted path, for instance).

Calculating an average may include (in a manner known per se to those of skill in the art) integrating or low-pass filtering the output signal from the multiplexer 12 intended to be averaged.

Figures 3A, 3B:
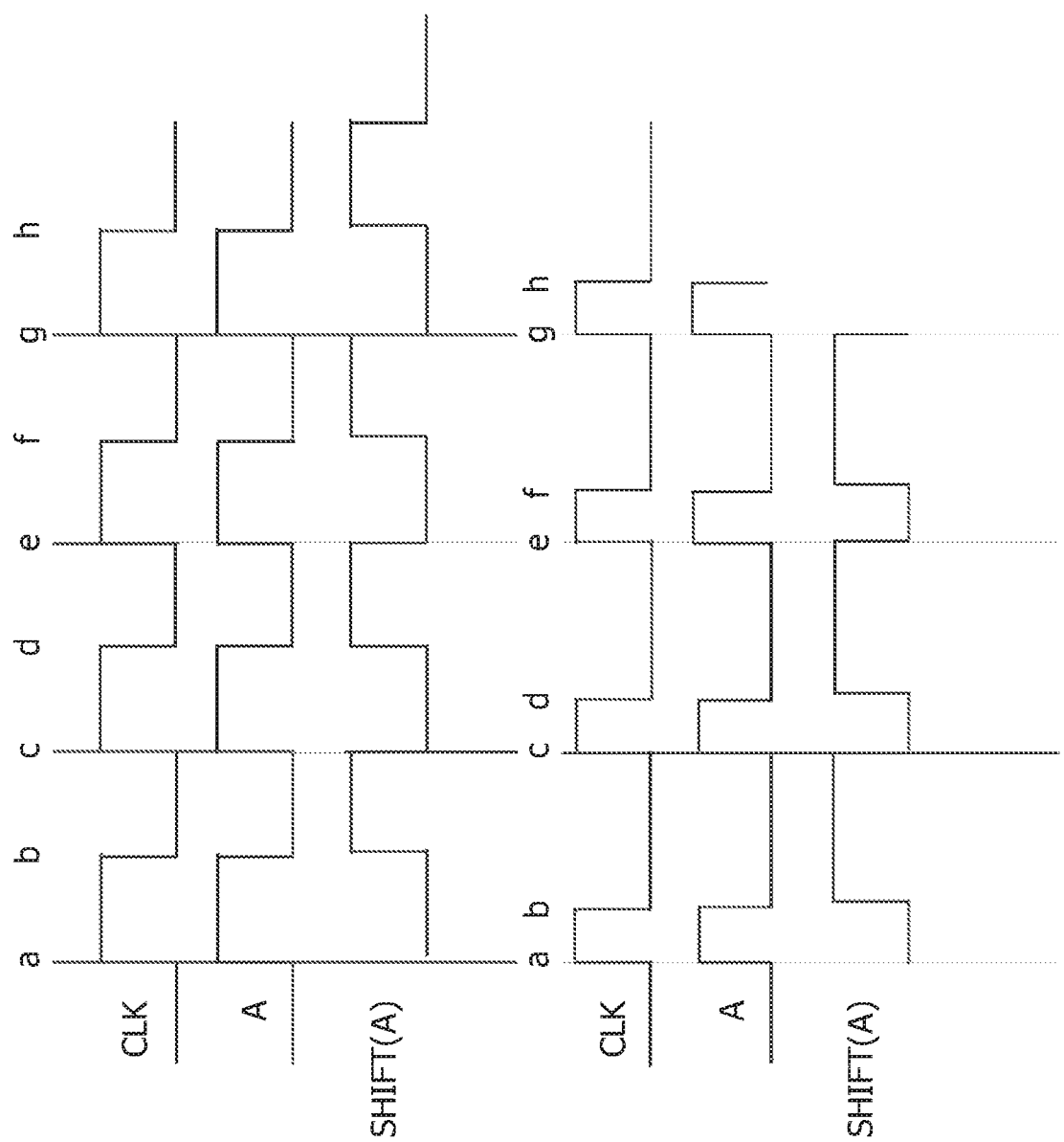
FIGS. 3A to 3D are further explanatory diagrams of embodiments of the present description.
Figure 3C:
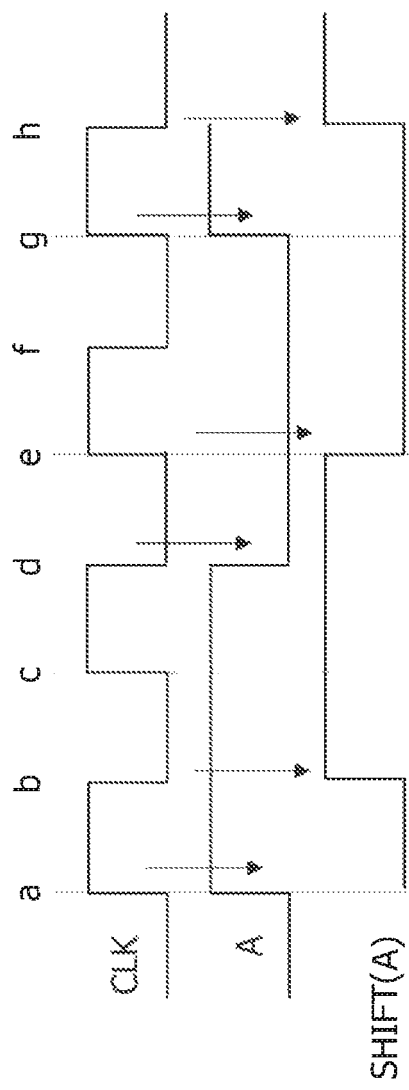

The concept discussed in the foregoing is further exemplified in the diagrams of FIGS. 3A to 3D. The diagrams in FIGS. 3A and 3C are exemplary of a situation where the data streams A and SHIFT(A) are clocked by an ideal clock signal CLK having rising and falling edges at times a, b, c, d, e, f, g, h, . . . that correspond to a (perfect) 50% duty cycle. In that case (no duty cycle distortion), the data streams A and SHIFT(A) will have identical average values AVE(A) and AVE(SHIFT(A)).

Figure 3D:
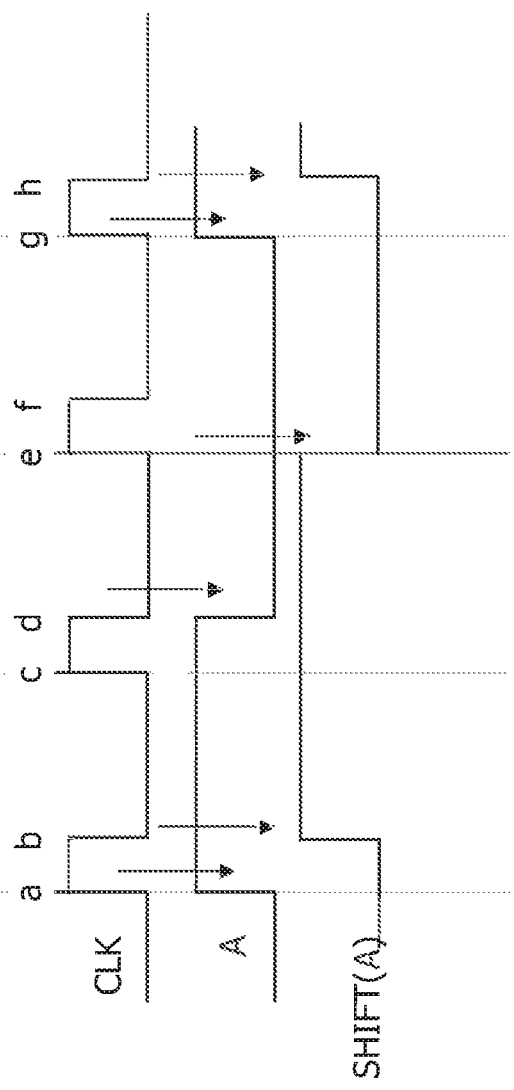

Conversely, the diagrams in FIGS. 3B and 3D are exemplary of a situation where the data streams A and SHIFT(A) are clocked by a non-ideal clock signal CLK affected by duty cycle distortion, that is a duty cycle different from 50% (for instance a duty cycle less than 50%) so that, for instance, the logical "high" times are shorter than the logical "low" times, with the falling edges at times b, d, f, h, . . . failing to lie halfway the adjacent rising edges at times a and c, c and e, e and g, . . . .

In that case (namely in the presence of duty cycle distortion) the data streams A and SHIFT(A) will no longer have identical average values AVE(A) and AVE(SHIFT(A)), with, for instance, AVE(A) being less than AVE(SHIFT(A)).

Comparing FIGS. 3A and 3B, on the one hand, with FIGS. 3C and 3D, on the other hand, highlights that the foregoing applies irrespective of whether the calibration patterns A and SHIFT(A) are isochronous with—that is, have the same frequency as—the clock signal CLK.

Figure 4:
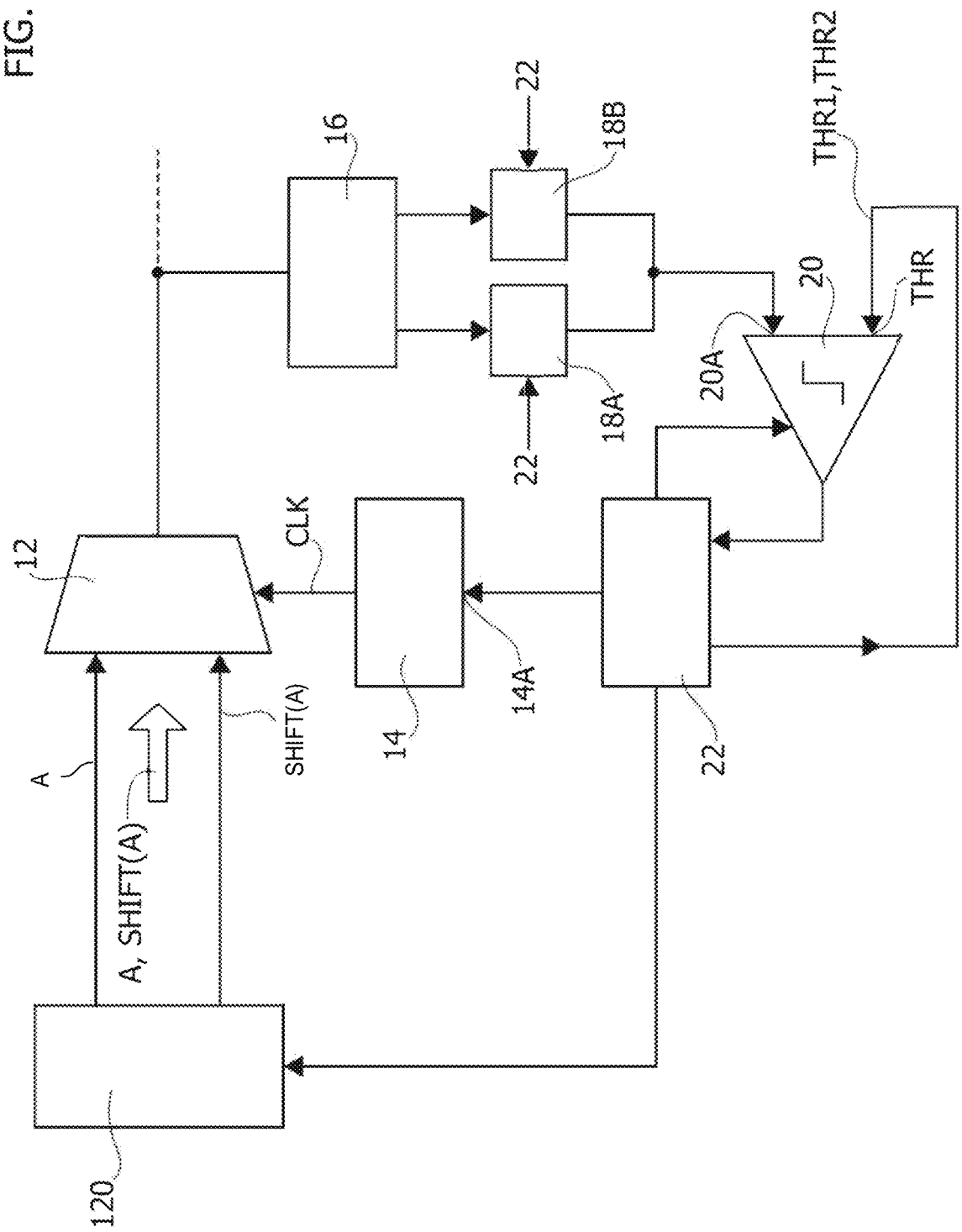
FIG. 4 is a diagram exemplary of a transmitter according to embodiments of the present description.

FIG. 4 is a diagram of a transmitter 10 configured according to the embodiments of the present description. The transmitter 10 is again illustrated as comprising a multiplexer 12 capable of being configured to multiplex input data streams A1, . . . and B0, B1, . . . into a single output data stream A0, B0, A1, B1, . . . as for transmission to a receiver over a communication channel such as a serial high-speed interconnection.

Neither the receiver nor the communication channel is visible in FIG. 4, highlighting that solutions described herein can be implemented for adequate duty cycle calibration on the transmitter side without involving a receiver.

While presented and discussed here as a distinct element for ease of explanation and understanding, the multiplexer 12 may be a multiplexer as indicated by reference MUX in FIGS. 1, 2 (and 4, to be discussed in the following) included in a transmitter configured to produce from a plurality of input data streams S1, . . . , Sn a combined transmission data stream at a first data rate (in the range of 1 Gb/s a 200 Gb/s, for instance) such a multiplexer being otherwise operable as the multiplexer 12 of FIG. 3 during the calibration/compensation phase discussed in connection with FIG. 3.

In that case (as discussed in the following), the multiplexer 12 can be configured to multiplex a first calibration data pattern A and a second calibration data pattern SHIFT(A) (a logically inverted replica of the data pattern A, for instance) into a multiplexed data calibration pattern A, SHIFT(A) at second data rate that, advantageously, is (much) lower than the first data rate of the combined transmission data stream S1, . . . , Sn.

As previously noted in the foregoing, by comparing FIGS. 3A and 3B, on the one hand, with FIGS. 3C and 3D, on the other hand, the principle underlying the embodiments does not require the calibration patterns A, SHIFT(A) to be at the same frequency as the clock signal CLK.

In various embodiments, the calibration/compensation phase of the clock duty cycle aims to adjust to 50% the duty cycle of the clock signal CLK at the transmitter 10 to facilitate the proper operation of a multiplexer, as indicated as MUX, in response to being clocked with a clock signal having an error-free, 50% duty cycle.

Also, it is again noted that, for simplicity, single-ended signals are represented and assumed throughout this description for input patterns, clocks, output patterns, and so on. Differential signals are, in fact, commonly used in real environments: the single-ended signals represented here may thus represent either real single-ended signals, the difference between two terminals of differential signals, or one of the two lines of a differential signal.

The multiplexer 12 is clocked by a clock generator 14 configured (in a manner known per se to those of skill in the art) to produce a high-speed (high-frequency) clock signal CLK.

As discussed previously with the input data streams A, SHIFT(A) clocked by an ideal clock signal CLK having a notionally perfect, 50% duty cycle, in the transmitted (multiplexed) output data stream, the data corresponding to a first input data stream, will have the same duration of the data corresponding to a second input data stream. In the presence of a non-ideal clock CLK affected by duty cycle distortion (namely a duty cycle different from 50%) the duty cycle distortion will adversely affect the transmitted data stream, for instance, with the data corresponding to a first input data stream (expected to have the same duration of the data corresponding to a second input data stream) having a different (for instance, shorter or longer) duration.

Solutions, as discussed herein, facilitate duty cycle calibration with duty cycle distortion corrected by controlling the duty cycle of the clock signal CLK. This may be by acting (again in a manner known per se to those of skill in the art, for instance, via a digital control word) on a duty cycle control input 14A to the clock generator 14.

As noted, the advantages of such duty cycle calibration with duty cycle distortion corrected can also extend to arrangements where more than two input data streams are multiplexed.

The block diagram of FIG. 4 illustrates a transmitter circuit 10 configured for duty cycle calibration to correct duty cycle distortion, as discussed in the foregoing. A transmitter configured according to the exemplary block diagram of FIG. 4 can implement (for instance, under the control of circuit "intelligence" represented by a microcontroller 22 to be further discussed in the following) calibration phases where the multiplexer 12 has applied to its inputs the two calibration streams A and then SHIFT(A) obtained (in a manner known to those of skill in the art) from a generator 120 activated during a calibration phase.

During the calibration phase, the two inputs to the multiplexer 12 will receive from the generator block 120 in the first sub-phase (step 1), the calibration pattern A, and in a second sub-phase (step 2), the "shifted" calibration pattern SHIFT(A), a logically inverted replica of the calibration pattern A, for instance.

In the exemplary case illustrated, the calibration data streams (calibration patterns) are de facto the same pattern A from the generator 120 that is subsequently applied to the two inputs of the multiplexer 12 as a direct pattern A and as a shifted pattern SHIFT(A) obtained by logically inverting the direct pattern.

A pattern SHIFT(A) obtained via logical inversion (low>high, high>low) is exemplary of a shifted pattern that, in comparison to pattern A, has a different relationship (shift) versus the rising and falling edges of the clock signal CLK.

In the case of logical inversion (FIGS. 3A to 3D can be again referred to for ease of understanding), that different relationship results from the role of the rising and falling edges of the clock signal CLK being "reversed" or "inverted", in that the pattern A is designed to switch from low to high on rising edges of the clock signal CLK and from high to low on falling edges of the clock signal CLK, and the pattern SHIFT(A) is designed to switch from low to high on falling edges of the clock signal CLK and from high to low on rising edges of the clock signal CLK.

The patterns A and SHIFT(A), as illustrated herein, are thus exemplary of a first calibration data pattern A having a first configuration of transitions between logical values and a second calibration data pattern SHIFT(A) that is a replica of the first calibration data pattern A and has a second configuration of transitions between logical values.

In the patterns A and SHIFT(A) illustrated herein, the second configuration of transitions between logical values in the second calibration data pattern SHIFT(A) is thus shifted with respect to the first configuration of transitions between logical values in the first calibration data pattern A.

Logical inversion as exemplified herein represents an advantageous "shifting" option due to the inherent simplification in the generation block 120.

However, the embodiments are not limited to shifting implemented via logical inversion. Various embodiments may can rely of shifted patterns SHIFT(A) having a different relationship (shift) versus the rising and falling edges of the clock signal CLK with respect to the direct pattern A obtained, for instance, via phase shifts or delays, thus resulting in different average values AVE(A) and AVE (SHIFT(A)) that indicate an existing duty cycle distortion (and provide a measure of that distortion).

Advantageously, provided they are mutually shifted as discussed, that has a different relationship versus the edges of the transmitting clock, for instance, with the one being at a first logic level (for instance, "high" or "1"), while the other is at a second, complementary logic level (for instance, "low", namely "0", "−1"), the calibration patterns A and SHIFT(A) can have a rate different—for instance (much) lower—than the high-speed rate intended for final operation of the transmitter.

An interesting feature of various embodiments thus lies in that, once a shift as desired is provided, the patterns A and SHIFT(A) may have one logic level equal to zero (that is, logic levels "1" and "0", for instance) or neither logic level equal to zero (that is, logic levels "1" and "−1", for instance).

In the block diagram of FIG. 4, reference 16 indicates an averaging circuit block (for instance, an integrator or low-pass filter circuit block of any known type to those of skill in the art) that receives the multiplexed data stream made up of the pattern A—during sub-phase 1—or the pattern SHIFT (A)—during sub-phase 2 and calculates respective average values AVE(A) or AVE(SHIFT(A)) over the duration of each calibration pattern.

As noted, in the absence of duty cycle distortion, the single-shift operation would not alter a pattern's average property.

To summarize, the arrangement illustrated in FIG. 4 comprises a clock signal generator 14 configured to produce a clock signal CLK having a duty cycle; the clock signal generator 14 has a duty cycle control input 14A, a multiplexer 12 configured to receive (from a generator 120 of any known type for that purpose) a first calibration data pattern A and a second calibration data pattern SHIFT(A), wherein the second calibration data pattern SHIFT(A) is a shifted replica of the first calibration data pattern A, namely a replica of the first calibration data pattern A, having a different relationship versus the edges of the transmitting clock CLK.

The multiplexer 12 is configured to be clocked by the clock signal CLK and to multiplex the two inputs representing either the first calibration data pattern A or the second calibration data pattern SHIFT(A) into a multiplexed calibration data pattern.

As used herein, the designation calibration data pattern applies to a signal having first and second logical values, namely "high" and "low", as is the case for clock signals.

For instance, the calibration data pattern A—and thus its shifted (here, logically inverted) replica SHIFT(A)—may include an alternation of N logic levels, with equal numbers N/2 of "high" and "low" logic levels.

With the multiplexer 12 clocked by an ideal clock signal CLK having a (perfect) 50% duty cycle, the average values AVE(A) and AVE(SHIFT(A)) for such calibration data pattern will have notionally identical values, with "high" and "low" logic levels having the same duration in both A and SHIFT(A).

In the presence of a non-ideal clock CLK affected by duty cycle distortion (namely, a duty cycle different from 50%), the duty cycle distortion will adversely affect the transmitted data pattern A and SHIFT(A) differently.

In fact, because of the shift, their "high" and "low" logic levels will be triggered by opposite edges of the transmitting clock, affected by duty cycle distortion.

By way of example, logical "highs" and "lows" becoming longer and shorter, respectively, in the pattern A due to a non-ideal clock CLK (duty cycle different from 50%) will turn into logical "highs" and "lows" becoming shorter and longer, respectively, in the pattern SHIFT(A).

The averaged values AVE(A) and AVE(SHIFT(A)) will thus differ, with the difference increasing as the duty cycle distortion increases (see again FIGS. 3A to 3D). That is, the averaged values AVE(A) and AVE(SHIFT(A))—for instance, the difference therebetween—are a measure of the error affecting the duty cycle of the clock signal CLK produced by the generator 14.

This applies irrespective of whether the patterns A and SHIFT(A) have one logic level equal to zero (that is, logic levels "1" and "0", for instance) or neither logic level equal to zero (that is, logic levels "1" and "−1", for instance). As exemplified in FIG. 4, the averaged values AVE(A) and AVE(SHIFT(A))—integrated or low-pass filtered values, for instance—can be stored (as analog values, for instance) in respective storage circuits 18A, 18B (capacitors, for instance) to be used to control, via the input 14A, the duty cycle of the clock generator 14 to compensate the error (deviation from 50%) therein.

In a first possible implementation, the related processing may involve analog-to-digital conversion using an ADC converter of the values (for instance, analog signals such as analog voltages) stored in the storage circuits 18A, 18B, calculating the difference between the digital values resulting from conversion, and applying the digital word indicative of the calculated difference to the control input 14A of the clock generator 14.

In a possible advantageous implementation as illustrated herein, such an ADC conversion (and the related, cost- and space-consuming circuitry) can be replaced by a comparator 20 with a (digitally) programmable threshold input THR acting under the control of circuit "intelligence" (a microcontroller 22) that drives the comparator 20 (and the circuitry associated therewith) in a first phase, where the average values AVE(A) stored in the storage circuit 18A is applied to an input 20A of the comparator 20 and the (digital) value of the threshold THR is adjusted (e.g., in digitally controlled steps) until a threshold value THR1 is reached which causes the comparator 20 to change its state with AVE(A) applied to the input 20A; and a second phase, where the average value AVE(SHIFT(A)) stored in the storage circuit 18B is applied to an input 20A of the comparator 20 and the (digital) value of the threshold THR is adjusted (e.g., in digitally controlled steps) until a threshold value THR2 is reached which causes the comparator 20 to change its state with AVE(SHIFT(A)) applied to the input 20A.

These "toggling" values THR1, THR2 of the threshold THR amount to measurements of AVE(A) and AVE(SHIFT(A)) and any difference therebetween as recorded by the circuit "intelligence" 22 can be used to produce a duty cycle calibration word (THR1−THR2) to be applied to the input 14A of the clock generator 14.

The difference/calibration word (THR1−THR2) is zero when THR1=THR2, namely when the measurements of AVE(A) and AVE(SHIFT(A)) are equal (no duty cycle error); convey positive or negative compensation values, based on the sign of the difference between measurements of AVE(A) and AVE(SHIFT(A)), namely based on the difference (with sign) between the (digital) values THR1, THR2 of the threshold THR that causes the comparator 20 to change its state with AVE(A) and AVE(SHIFT(A)) applied as an input, respectively.

The (difference between the) two thresholds THR1, THR2 that have been identified in the two measurement phases—can thus be used at the control input 14A of the clock generator 14 to close a control loop that targets (that is, has as its target or object) maintaining the duty cycle of the signal CLK at 50% (namely, as closely as possible to 50% as a function of the resolution available for the values THR1, THR2 for the threshold THR of the comparator 20).

It is once more noted that the foregoing applies irrespective of whether the patterns A and SHIFT(A) have one logic level equal to zero (that is, logic levels "1" and "0", for instance) or neither logic level equal to zero (that is, logic levels "1" and "−1", for instance).

Solutions, as described herein, are thus based on noting that patterns such as AVE(A) and AVE(SHIFT(A)) convey information about the presence of duty cycle distortion.

The difference between them, for instance, indicates a duty cycle distortion in the clock signal, which can be used for (closed-loop) compensation of duty cycle distortion.

To summarize, arrangements as illustrated in FIG. 4 include a control circuitry of the duty cycle of the clock signal CLK of the clock signal generator 14, comprising averaging circuitry 16 (integrator or low-pass circuitry or a type known per se, for instance) configured to produce first and second averaged signals AVE(A) and AVE(SHIFT(A) for the first calibration data pattern A and the second calibration data pattern SHIFT(A) subsequently applied to the inputs to the multiplexer 12.

Arrangements, as illustrated in FIG. 4, further include duty cycle control circuitry (the comparator 20 controlled by the controller 22, for instance) configured to detect a difference between the first and second averaged signals AVE(A) and AVE(SHIFT(A) for the first calibration data pattern A and the second calibration data pattern SHIFT(A), and apply to the duty cycle control input 14A of the clock signal generator 14 a duty cycle control signal based on the difference detected between the first and second averaged signals AVE(A) and AVE(SHIFT(A)).

Such a closed-loop control takes place by targeting (that is, having as a target) a 50% duty cycle of the clock signal CLK of the clock signal generator 14.

Such a closed-loop control may take place in any manner known to those of skill in the art for that purpose, for instance, no correction of the duty cycle of the clock signal CLK of the clock signal generator 14 if the first and second averaged signals AVE(A) and AVE(SHIFT(A)) are found to be equal (difference THR1−THR2 equal to zero), correction of the duty cycle of the clock signal CLK of the clock signal generator 14 in a first direction (increase, for instance) if the difference AVE(A)−AVE(SHIFT(A)), namely (THR1−THR2) has a first sign, and correction of the duty cycle of the clock signal CLK of the clock signal generator 14 in a second direction (decrease, for instance) if the difference AVE(A)−AVE(SHIFT(A)), namely (THR1−THR2) has a second sign, opposite the first.

The choice of the sign (direction) of correction as a function of the sign of the difference may depend on the specific implementation options (the pattern A, for instance). Delays may be involved in applying the correction to counter undesired instability of the control loop.

Figure 5:
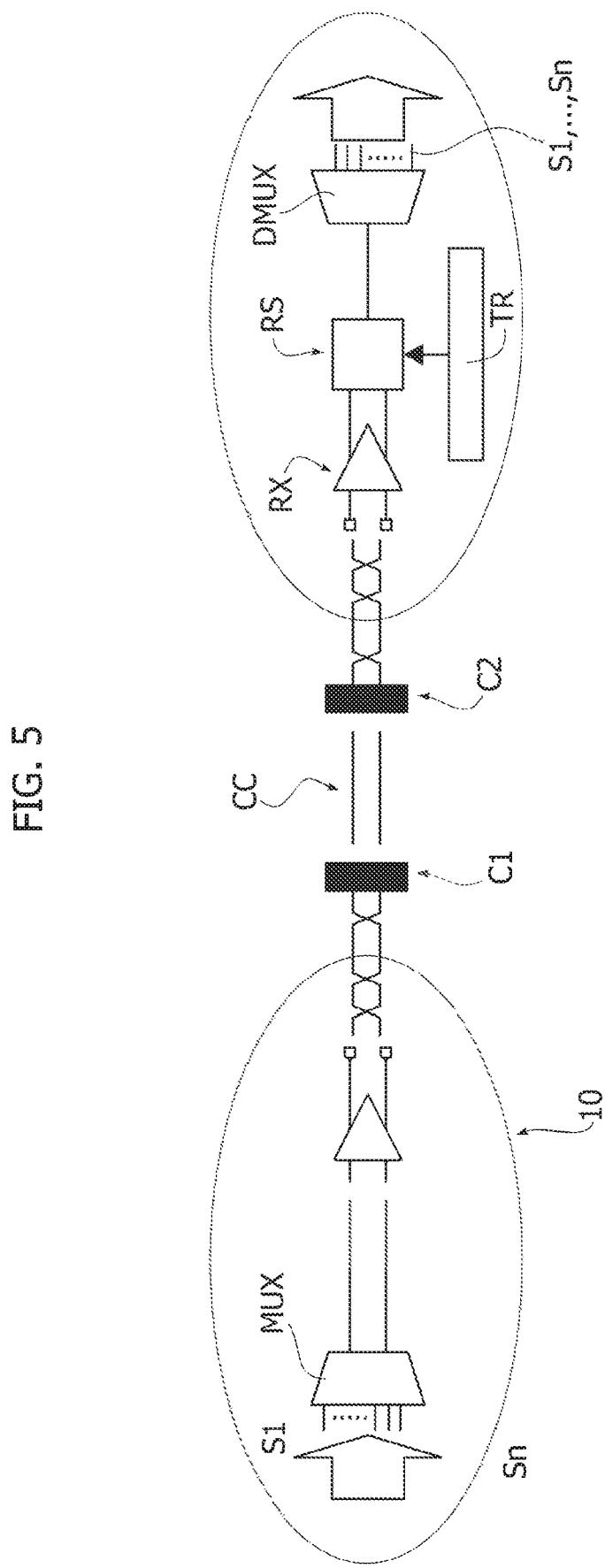
FIG. 5 is a block diagram of a communication system including embodiments of the present description.

FIG. 5 is a block diagram of a communication system, including embodiments of the present description that can be used, for instance, in a SerDes (Serializer/Deserializer) context. This system can be used in high-speed data communications to compensate for limited input/output by converting data between serial data and parallel interfaces in each direction.

For instance, a primary use of a SerDes system (referred to herein merely by way of example, with no limiting intent of the embodiments) may be to provide data transmission over a single line or a differential pair to minimize the number of I/O pins and interconnects.

In such a system, a transmitter 10 as discussed in the foregoing, is configured to transmit a data stream resulting from multiplexing two (or more) input data streams S1, . . . , Sn towards a receiver RX over a communication channel CC such as, for instance, a cable, a board (printed circuit board, PCB or a backplane) with the transmitter 10 and the receiver RX coupled to the communication channel CC via connectors C1, C2 (of a type known to those of skill in the art).

In FIG. 5, references MUX and DMUX denote a multiplexer and a de-multiplexer configured (in a manner known to those of skill in the art) for multiplexing/de-multiplexing data streams S1, . . . , Sn before and after transmission on the communication channel CC.

For instance, as illustrated in FIG. 5 (and in a manner known per se to those of skill in the art), the receiver may have cascaded thereto ("upstream" of the de-multiplexer DMUX) a resampling block RS clocked by a timing recovery clock TR configured to extract from the multiplexed data stream received at the receiver RX timing (bitrate) information to be used in re-sampling that data stream given subsequent de-multiplexing.

The multiplexer MUX is thus presented in FIG. 5 as a separate element from the transmitter 10 primarily for ease of explanation. In certain embodiments, the multiplexer indicated as MUX in FIG. 5 may, in fact, operate as the multiplexer 12 during the calibration/compensation phase discussed in connection with FIG. 4, aiming to adjust to 50% the duty cycle of the clock signal CLK at the transmitter 10.

As discussed, while compatible with high-speed environments, duty cycle calibration/compensation, as discussed in the foregoing, can involve only low-frequency measurements, in so far as it may be based on low-frequency measures like averaging or integration.

Duty cycle calibration/compensation, as discussed in the foregoing, is largely insensitive to supply or noise effects in so far as the same measurement is performed on two different patterns, where non-idealities will be present in both cases.

Duty cycle calibration/compensation, as discussed in the foregoing, does not involve measurements in a receiver (such as R) and can be (fully) contained in a transmitter such as 10 configured to be calibrated.

It is noted that, in various embodiments, the blocks of FIG. 4 can be split between a transmitter and a receiver if this is desirable for implementation purposes.

Without prejudice to the underlying principles, the details and the embodiments may vary, even significantly, with respect to what has been described by way of example only without departing from the scope of the embodiments.

The extent of protection is determined by the annexed claims.

What is claimed is:

1. A circuit, comprising:
a clock signal generator configured to produce a clock signal, the clock signal generator having a duty cycle control input to control a duty cycle of the clock signal;
a multiplexer having inputs configured to multiplex input data patterns into a multiplexed output pattern in response to rising and falling edges of the clock signal;
a calibration data pattern generator configured to generate a first calibration data pattern and a second calibration data pattern as input data patterns to the multiplexer, wherein the first calibration data pattern has a first configuration of transitions between logical values, wherein the second calibration data pattern is a replica of the first calibration data pattern, wherein the second calibration data pattern has a second configuration of transitions between logical values, wherein the second configuration of transitions between logical values is shifted with respect to the first configuration of transitions; and
a control circuitry configured to generate a duty cycle control signal for the duty cycle control input of the clock signal generator, the control circuitry comprising:
an averaging circuitry coupled to an output of the multiplexer, the averaging circuitry configured to produce a first averaged signal and a second averaged signal in response to the multiplexer receiving the first calibration data pattern and the second calibration data pattern, respectively, and
a duty cycle control circuitry configured to:
detect a duty cycle distortion condition in the clock signal in response to the first averaged signal and the second averaged signal failing to have the same value; and
apply a duty cycle distortion compensation signal to the duty cycle control input based on an amount the first averaged signal and the second averaged signal diverge from the same value while targeting a 50% duty cycle of the clock signal of the clock signal generator.

2. The circuit of claim 1, wherein the second calibration data pattern is a logically inverted replica of the first calibration data pattern.

3. The circuit of claim 1, wherein the duty cycle control circuitry is configured to apply the duty cycle distortion compensation signal to the duty cycle control input based on a difference between the first averaged signal and the second averaged signal.

4. The circuit of claim 1, wherein the averaging circuitry includes an integrator circuitry or a low-pass filtering circuitry configured to integrate or low-pass filter the output signal of the multiplexer in response to the inputs of the multiplexer receiving the first calibration data pattern and the second calibration data pattern.

5. The circuit of claim 1, wherein the calibration data pattern generator is configured to generate the first calibration data pattern and the second calibration data pattern using first logic levels that are non-zero signal levels and second logic levels that are zero signal levels, first logic levels and second logic levels that are non-zero signal levels, an equal number of first and second logic levels in the first calibration data pattern and the second calibration data pattern, or a combination thereof.

6. The circuit of claim 1, further comprising a signal storage circuitry configured to store the first averaged signal and the second averaged signal.

7. The circuit of claim 6, wherein the signal storage circuitry is configured to store the first averaged signal and the second averaged signal as analog signals, and wherein the duty cycle control circuitry is coupled to the signal storage circuitry and configured to generate the duty cycle distortion compensation signal from the first averaged signal and the second averaged signal stored in the signal storage circuitry.

8. The circuit of claim 1, further comprising:
a comparator having a comparator input configured to receive the first averaged signal and the second averaged signal, wherein the comparator has an adjustable threshold value; and
a controller configured to alternately drive the comparator in a first operating stage and a second operating state,
wherein, in the first operating state, the comparator receives the first averaged signal at the comparator input, the adjustable threshold value adjusted to a first threshold value causing the comparator to toggle, and
wherein, in the second operating state, the comparator receives the second averaged signal at the comparator input, the adjustable threshold value adjusted to a second threshold value causing the comparator to toggle, the first threshold value and the second threshold value being indicative of the amount the first averaged signal and the second averaged signal diverge from the same value.

9. The circuit claim 8, wherein the comparator has a digitally adjustable threshold value, wherein the first threshold value, the second threshold value, or a difference therebetween, provide a digital duty cycle distortion compensation for the duty cycle control input.

10. A system, comprising:
a transmitter configured to receive a plurality of input data streams and produce therefrom a combined transmission data stream based on a clock signal of a clock signal generator, wherein the transmitter comprises a duty cycle calibration circuit, the duty cycle calibration circuit comprising:
the clock signal generator configured to produce the clock signal, the clock signal generator having a duty cycle control input to control a duty cycle of the clock signal,
a multiplexer having inputs configured to multiplex input data patterns into a multiplexed output pattern in response to rising and falling edges of the clock signal,
a calibration data pattern generator configured to generate a first calibration data pattern and a second calibration data pattern as input data patterns to the multiplexer, wherein the first calibration data pattern has a first configuration of transitions between logical values, wherein the second calibration data pattern is a replica of the first calibration data pattern, wherein the second calibration data pattern has a second configuration of transitions between logical values, wherein the second configuration of transitions between logical values is shifted with respect to the first configuration of transitions, and
a control circuitry configured to generate a duty cycle control signal for the duty cycle control input of the clock signal generator, the control circuitry comprising:
an averaging circuitry coupled to an output of the multiplexer, the averaging circuitry configured to produce a first averaged signal and a second averaged signal in response to the multiplexer receiving the first calibration data pattern and the second calibration data pattern, respectively; and a duty cycle control circuitry configured to:
detect a duty cycle distortion condition in the clock signal in response to the first averaged signal and the second averaged signal failing to have the same value, and
apply a duty cycle distortion compensation signal to the duty cycle control input based on an amount the first averaged signal and the second averaged signal diverge from the same value while targeting a 50% duty cycle of the clock signal of the clock signal generator; and a receiver coupled to the transmitter, the receiver configured to receive the combined transmission data stream and obtain therefrom a plurality of output data streams that replicate the plurality of input data streams.

11. The system of claim 10, wherein the transmitter is configured to produce a combined transmission data stream at a first data rate from the plurality of input data streams, and wherein the multiplexer is configured to multiplex the first calibration data pattern and the second calibration data pattern at a second data rate, the second data rate being lower than the first data rate of the combined transmission data stream.

12. The system of claim 11, wherein the averaging circuitry includes an integrator circuitry or a low-pass filtering circuitry configured to integrate or low-pass filter the output signal of the multiplexer in response to the inputs of the multiplexer receiving the first calibration data pattern and the second calibration data pattern.

13. The system of claim 11, wherein the calibration data pattern generator is configured to generate the first calibration data pattern and the second calibration data pattern using first logic levels that are non-zero signal levels and second logic levels that are zero signal levels, first logic levels and second logic levels that are non-zero signal levels, an equal number of first and second logic levels in the first calibration data pattern and the second calibration data pattern, or a combination thereof.

14. The system of claim 11, wherein the duty cycle calibration circuit further comprises a signal storage circuitry configured to store the first averaged signal and the second averaged signal, wherein the signal storage circuitry is configured to store the first averaged signal and the second averaged signal as analog signals, and wherein the duty cycle control circuitry is coupled to the signal storage circuitry and configured to generate the duty cycle distortion compensation signal from the first averaged signal and the second averaged signal stored in the signal storage circuitry.

15. A method, comprising:
generating a clock signal having rising and falling edges;
applying a first calibration data pattern and a second calibration data pattern to inputs of a multiplexer;
multiplexing the first calibration data pattern and the second calibration data pattern into a multiplexed output pattern in response to rising and falling edges of the clock signal, wherein the first calibration data pattern has a first configuration of transitions between logical values, wherein the second calibration data pattern is a replica of the first calibration data pattern having a second configuration of transitions between logical values, wherein the second configuration of transitions between logical values of the second calibration data pattern is shifted with respect to the first configuration of transitions between logical values of the first calibration data pattern;
averaging the multiplexed output pattern to generate a first averaged signal and a second averaged signal in response to the inputs of the multiplexer receiving the first calibration data pattern and the second calibration data pattern;
detecting a duty cycle distortion condition in the clock signal in response to the first averaged signal and the second averaged signal failing to have a same value; and
applying a duty cycle distortion compensation signal to a duty cycle control input of a clock signal generator based on an amount the first averaged signal and the second averaged signal diverge from said same value while targeting a 50% duty cycle of the clock signal.

16. The method of claim 15, wherein the second calibration data pattern is a logically inverted replica of the first calibration data pattern.

17. The method of claim 15, further comprising applying the duty cycle distortion compensation signal to the duty cycle control input based on a difference between the first averaged signal and the second averaged signal.

18. The method of claim 15, further comprising integrating or low-pass filtering the multiplexed output pattern in response to receiving the first calibration data pattern and the second calibration data pattern.

19. The method of claim 15, further comprising generating the first calibration data pattern and the second calibration data pattern using first logic levels that are non-zero signal levels and second logic levels that are zero signal levels, first logic levels and second logic levels that are non-zero signal levels, an equal number of first and second logic levels in the first calibration data pattern and the second calibration data pattern, or a combination thereof.

20. The method of claim 15, further comprising:
storing the first averaged signal and the second averaged signal as analog signals in a signal storage circuitry; and
generating the duty cycle distortion compensation signal from the first averaged signal and the second averaged signal stored in the signal storage circuitry.

* * * * *